(12) United States Patent
Murakuki et al.

(10) Patent No.: US 6,219,285 B1
(45) Date of Patent: Apr. 17, 2001

(54) SEMICONDUCTOR STORAGE DEVICE WITH SYNCHRONIZED SELECTION OF NORMAL AND REDUNDANT COLUMNS

(75) Inventors: Yasuo Murakuki; Akinori Shibayama, both of Kyoto (JP)

(73) Assignee: Mitsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/433,696

(22) Filed: Nov. 3, 1999

(30) Foreign Application Priority Data

Nov. 13, 1998 (JP) .................................................. 10-323619

(51) Int. Cl.[7] ...................................................... G11C 7/00
(52) U.S. Cl. ............... 365/200; 365/230.03; 365/230.06; 365/233
(58) Field of Search ............................... 365/200, 230.03, 365/230.06, 233

(56) References Cited

U.S. PATENT DOCUMENTS

| | | | |
|---|---|---|---|
| 4,849,938 | * 7/1989 | Furutani et al. | 365/200 |
| 5,297,085 | 3/1994 | Choi et al. | |
| 5,808,948 | * 9/1998 | Kim et al. | 365/201 |
| 5,889,727 | * 3/1999 | Hsu et al. | 365/233 |
| 5,970,001 | * 10/1999 | Noda et al. | 365/200 |

* cited by examiner

*Primary Examiner*—David Nelms
*Assistant Examiner*—Connie C. Yoha
(74) *Attorney, Agent, or Firm*—Harness, Dickey & Pierce, P.L.C.

(57) ABSTRACT

In a semiconductor storage device, a dummy redundancy decision circuit detects the endpoint of redundancy decision made by a column redundancy decision circuit and outputs a end-of-redundancy-decision signal RED. Responsive to the signal RED, a control signal generator outputs normal and redundant column control signals NEN and REN to normal and redundant column decoders, respectively, based on a result of the redundancy decision made by the column redundancy decision circuit and represented by a signal XSYP. Accordingly, a time a normal column select signal Y is output to select a normal column and a time a redundant column select signal SY is output to select a redundant column are both later than a reference time by an interval of the same length. In addition, the interval between the end of data line pre-charging and the start of data line potential amplification can be shortened. As a result, data can be read out much faster.

5 Claims, 7 Drawing Sheets

Prior Art

SEMICONDUCTOR STORAGE DEVICE WITH SYNCHRONIZED SELECTION OF NORMAL AND REDUNDANT COLUMNS

BACKGROUND OF THE INVENTION

The present invention generally relates to a technique of increasing the operating speed of a semiconductor storage device, and more particularly relates to controlling column selection and data line potential amplification in a DRAM.

FIG. 11 schematically illustrates an ordinary configuration of a conventional DRAM. In the DRAM shown in FIG. 11, an address signal is input to an input/output (I/O) interface and controller 50. A row address represented by the address signal is decoded by a row decoder 51 to select a particular word line WL. The data of a plurality of memory cells M belonging to the selected word line WL are output to associated bit lines BL. Then, the data read out on the bit lines BL are amplified by a sense amplifier SA. Thereafter, a column address AY is provided to the I/O interface 50 and then decoded by a column decoder 52 to select a particular column select line CSL. When the particular column select line CSL is selected, a column switch CS connected to the column select line CSL turns ON. As a result, the data on an associated bit line BL, which is connected to the column switch CS, is read out on an associated data line DL. The data read out on the data line DL is further amplified by a read amplifier (not shown in FIG. 11), selected by an I/O controller 53 and then output through the I/O interface 50 to an external component. Although not specifically shown in FIG. 11, the bit lines BL and data lines DL are each made up of a pair of complementary bit lines and a pair of complementary word lines, respectively.

The DRAM shown in FIG. 11 further includes a plurality of redundant memory cells RM to back up and substitute for memory cells with faults that are brought about during a manufacturing process. To replace a faulty memory cell M with an associated redundant memory cell RM, a redundant column decoder 52, which is integrated with the column decoder 52, selects a particular redundant column select line RCSL. When a redundant column switch RCS, which is connected to the redundant column select line RCSL, turns ON, the data on an associated redundant bit line RBL is read out onto the data line DL.

Although not shown in FIG. 11, the I/O interface and controller 50 generates various types of control signals such as address latch signal, sense amplifier starting signal, read amplifier starting signal and data output timing signal and controls data readout operations using these control signals.

FIG. 9 is a block diagram illustrating a column-selecting circuit section of the DRAM shown in FIG. 11. FIG. 10 is a timing diagram of respective control signals used in this circuit section. As shown in FIG. 9, a column pre-decoder 901 pre-decodes a column address AY to generate a column address pre-decoded signal YP, which is in turn decoded by a column decoder 902 to generate a column select signal Y. Then, the column select signal Y is input to an associated column switch CS, thereby selecting a normal column.

The column address AY and a redundant column address RAY, which is the column address of a faulty memory cell to be replaced with a redundant memory cell, are input to a column redundancy decision circuit 903. Responsive to a redundancy clock signal RCLK, the decision circuit 903 compares the column address AY to the redundant column address RAY to see if these addresses match up to each other. If the given column address AY is identical to the redundant column address RAY, then the decision circuit 903 outputs a redundant column address pre-decoded signal SYP to a redundant column decoder 904, which decodes the signal SYP to output a redundant column select signal SY. Responsive to the signal SY, the column switch CS selects an associated redundant column.

A pre-decoder controller 905 is provided to disable the selection of a normal column when the redundant column is selected. On receiving the signal SYP from the decision circuit 903, the controller 905 decides that a redundant column is now being selected. Then, the controller 905 outputs an assert/negate signal NEN such that the normal column address pre-decoded signal YP output from the column pre-decoder 901 is negated. As a result, the normal column select signal Y output from the column decoder 902 is also negated.

In FIG. 9, an address transition detector (ATD) 906 generates a one-shot pulse every time a signal representing the column address AY rises or falls. A delay circuit 907 delays the one-shot pulse generated by the ATD 906 to produce data line pre-charging and amplifying signals DLPRE and DLSEN such as those shown in FIG. 10, and output these signals to a read amplifier 908, thereby pre-charging and amplifying the data line DL.

However, it takes a rather long time for the conventional DRAM to select a column due to its configuration. This drawback will be detailed below.

In FIG. 9, the column pre-decoder 901 is not allowed to output the normal column address pre-decoded signal YP until the decoder 901 receives the assert/negate signal NEN from the pre-decoder controller 905. Accordingly, a phase difference θ exists between a time the normal column select signal Y is output to select a normal column and a time the redundant column select signal SY is output to select a redundant column as shown in FIG. 10. Due to the existence of the phase difference, the following control should be performed.

The data line DL should be pre-charged before the data on the bit line BL is read out on the data line DL as a result of column selection. That is to say, it is only after the data line DL has been pre-charged that the data on the bit line may be read out on the bit line and the potential on the line be amplified. However, since there is the phase difference, the interval between a reference time and a point in time the data on the bit line is read out on the data line differs depending on whether a normal or redundant column is selected. Accordingly, the start point of data line potential amplification should be no earlier than a point in time the later column select signal is output. As a result, the start of data readout operation is delayed. On the other hand, the end-point of data line pre-charging should be coincident with a point in time the earlier column select signal is output. Thus, a long time margin, including the phase difference θ, is needed after data line pre-charging is finished and before data line potential amplification is started. This delay constitutes an obstacle to speeding up the readout operation of the storage device.

Also, the data line pre-charging and amplifying signals DLPRE and DLSEN supplied to the read amplifier 908 are generated by getting the one-shot pulses, which are output from the ATD 906 every time the column address signal AY rises or falls, delayed by the delay circuit 907. Accordingly, there should be a long time interval after the column address signal AY rises or falls and before the signal DLPRE or DLSEN is generated. Furthermore, the characteristics of delay devices included in the delay circuit 907 are variable due to a variation in voltage or process-induced errors. Thus, if a long delay should be defined for these delay devices, then the delay times defined are greatly variable. As a result, if the data line pre-charging and amplifying signals DLPRE and DLSEN should be generated taking this variation into account, the long operation margin is needed as shown in FIG. 10, thus interfering with the high-speed operation of the storage device.

SUMMARY OF THE INVENTION

An object of the present invention is speeding up the operation of a semiconductor storage device by eliminating a phase difference between normal and redundant column select signals and thereby shortening the interval after a data line has been pre-charged and before a data line potential starts to be amplified.

Another object of the present invention is generating data line pre-charging and amplifying signals with a reduced operation margin in the semiconductor storage device attaining the former object.

To achieve these objects, according to the present invention, a column decoder and a redundant column decoder for outputting normal and redundant column select signals, respectively, are controlled by a single controller at the same time.

Specifically, a semiconductor storage device according to the present invention includes: a normal column decoder for outputting a normal column select signal; a redundant column decoder for outputting a redundant column select signal; a column switch, which selectively receives the normal or redundant column select signal to connect a bit line to an associated data line; and redundancy decision means for deciding whether or not an input column address matches up to a redundant column address. The storage device further includes: signal generating means for generating a first timing signal irrespective of a result of the decision made by the decision means; and operation selecting means, which receives the result of the decision made by the decision means and the first timing signal generated by the generating means and selectively outputs a normal or redundant operation selecting signal to the normal or redundant column decoder, respectively, based on the decision result on receiving the first timing signal.

In one embodiment of the present invention, the decision means decides whether or not the addresses match up to each other on receiving a second timing signal. The signal generating means generates the first timing signal responsive to the second timing signal.

In another embodiment of the present invention, the signal generating means is end-of-redundancy-decision signal generating means, which detects an endpoint of the decision made by the decision means and generates an end-of-redundancy-decision signal as the first timing signal.

In still another embodiment, the end-of-redundancy-decision signal generating means includes dummy redundancy decision means, which always decides that the input column address does not match up to the redundant column address.

In this particular embodiment, the redundancy decision means includes a first node pre-charged responsive to the second timing signal and a first group of transistors. The transistors of the first group are connected in parallel to each other between the first node and a reference potential node and controlled based on a result of a bit-by-bit comparison between the input and redundant column addresses. The redundancy decision means outputs the result of the comparison based on a potential at the first node. The dummy redundancy decision means includes a second node pre-charged responsive to the second timing signal and a second group of transistors. The transistors of the second group are connected in parallel to each other between the second node and the reference potential node. The number of the transistors of the second group is equal to the number of the transistors of the first group. One of the transistors of the second group is always ON. The dummy redundancy decision means outputs the end-of-redundancy-decision signal based on a potential at the second node.

In still another embodiment, the storage device further includes signal producing means for generating data line pre-charging and amplifying signals responsive to the first timing signal. The data line pre-charging and amplifying signals are used for pre-charging the data line and amplifying a potential on the data line, respectively.

According to the present invention, the single operation selecting means controls the normal or redundant column decoder responsive to every first timing signal. Specifically, when a normal column should be selected, the selecting means outputs a normal operation selecting signal to the normal column decoder. On the other hand, when a redundant column should be selected, the selecting means outputs a redundant operation selecting signal to the redundant column decoder. Thus, a time the normal column select signal is output to select a normal column and a time the redundant column select signal is output to select a redundant column are both later than a reference time by an interval of the same length. That is to say, the phase difference between these signals can be eliminated. As a result, the interval after a data line has been pre-charged and before a data line potential starts to be amplified can be shortened, thus contributing to the high-speed operation of the storage device.

In particular, according to the present invention, after the first timing signal has been generated responsive to the second timing signal, the data line pre-charging and amplifying signals are generated responsive to the first timing signal. Thus, the delay, which should be caused by delay devices used for generating these signals, may be shorter compared to generating the data line pre-charging signal responsive to the second timing signal. That is to say, the variation in delay time can be reduced. As a result, the operation timing margin between the end of data line pre-charging and the start of data line potential amplification can be shorter in view of the reduced variation in delay time. Therefore, the operation between the column selection and data line amplification can be speeded up.

DESCRIPTION OF THE PREFERRED EMBODIMENTS

Hereinafter, preferred embodiments of the present invention will be described with reference to the accompanying drawings.

Figure 1:
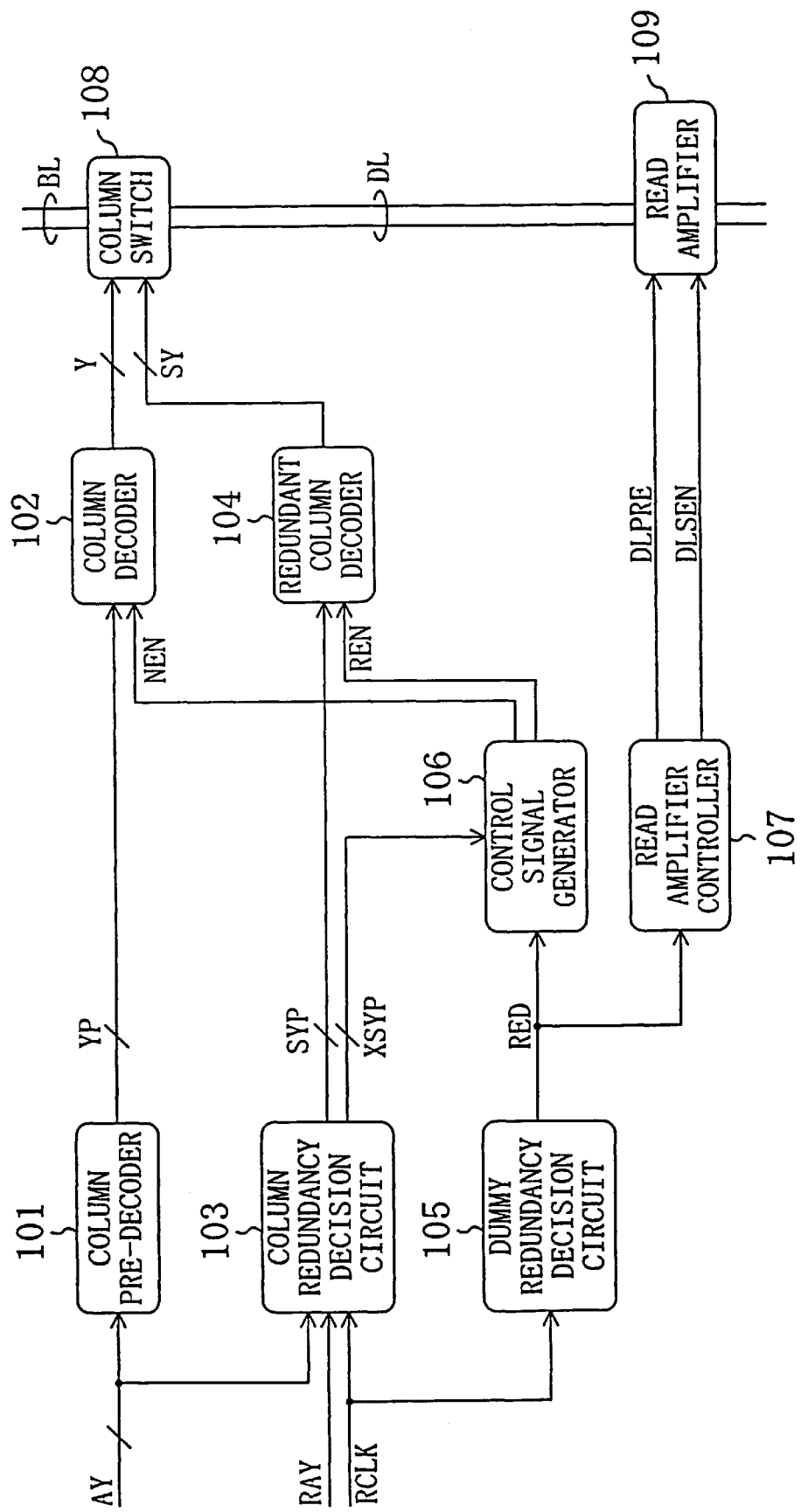
FIG. 1 is a block diagram illustrating main circuit components used for selecting a column in a DRAM according to an exemplary embodiment of the present invention.
Figure 11:
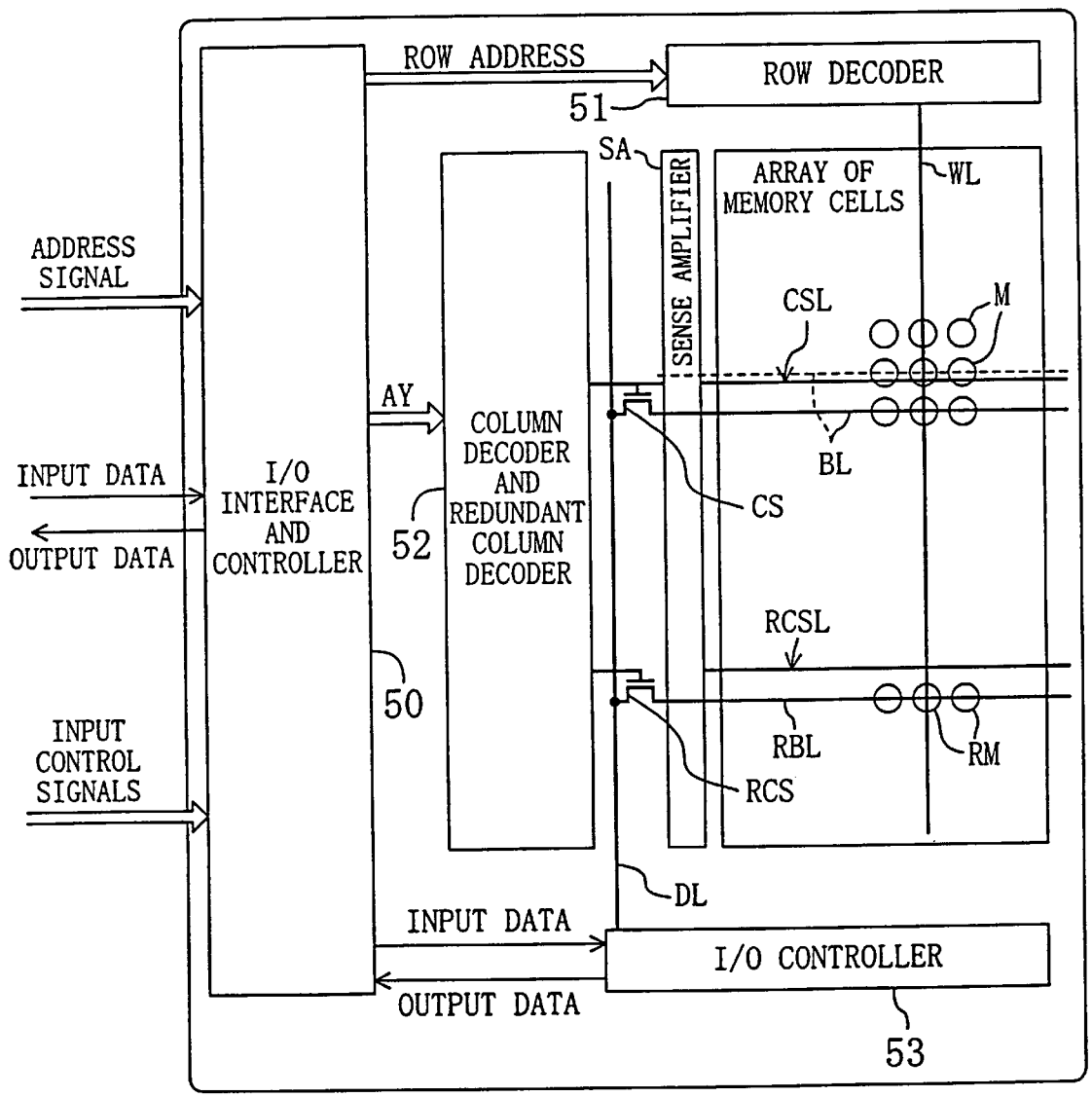
FIG. 11 is a block diagram illustrating an overall arrangement of a DRAM.

FIG. 1 illustrates main circuit blocks used for selecting a column in a DRAM according to an exemplary embodiment of the present invention. The overall arrangement of the inventive DRAM is similar to the conventional one illustrated in FIG. 11, and the description thereof will be omitted herein.

As shown in FIG. 1, this circuit section includes: column pre-decoder 101; (normal) column decoder 102; column redundancy decision circuit 103; redundant column decoder 104; dummy redundancy decision circuit 105; control signal generator 106; read amplifier controller 107; column switch 108; and read amplifier 109.

Next, the specific operations of these components will be described. The column pre-decoder 101 receives and pre-decodes a column address AY, thereby outputting a column address pre-decoded signal YP. The column redundancy decision circuit 103 receives the column address AY and a redundant column address RAY and compares these addresses to see if these addresses match up to each other responsive to every redundancy clock signal RCLK. Then, the circuit 103 outputs a redundant column address pre-decoded signal SYP and an inverted version thereof XSYP based on the decision result. When the circuit 103 decides that these addresses are identical to each other, the signal SYP rises to the H level. The redundant column address RAY is prepared for an associated column address of a faulty memory cell using a fuse, for example, during a product test. The redundancy clock signal RCLK falls to the L level when the column address AY is determined and then rises to the H level a predetermined time later. Responsive to the redundancy clock signal RCLK, the dummy redundancy decision circuit 105 detects the endpoint of the address comparison by the column redundancy decision circuit 103 and outputs an H-level end-of-redundancy-decision signal RED.

Figure 3:
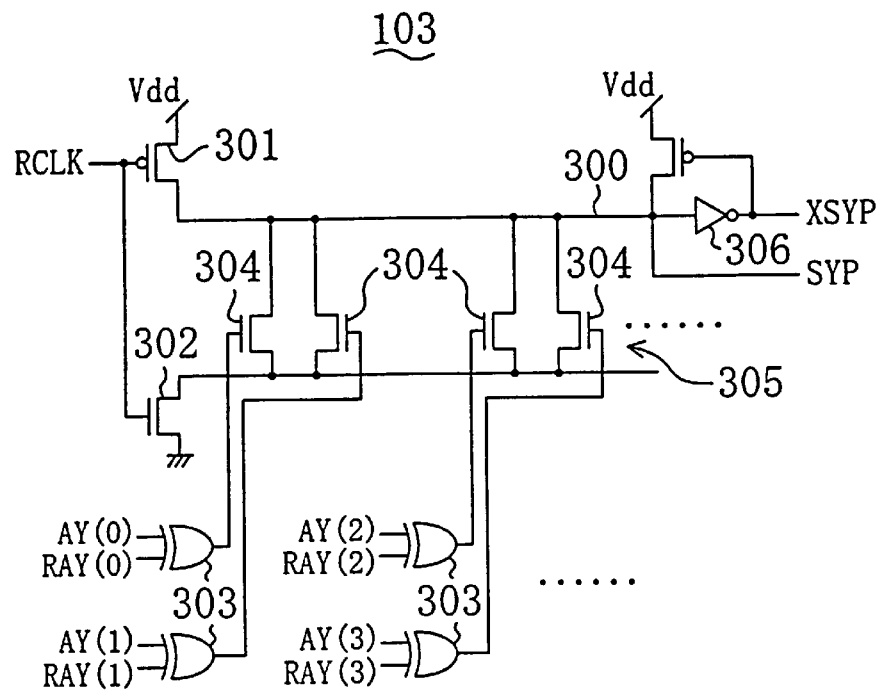
FIG. 3 is a circuit diagram illustrating a configuration for a redundancy decision circuit included in the DRAM.
Figure 4:
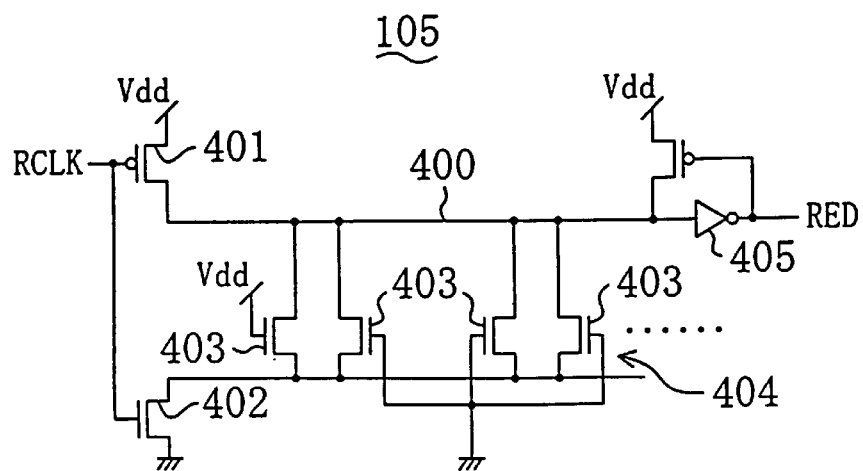
FIG. 4 is a circuit diagram illustrating a configuration for a dummy redundancy decision circuit included in the DRAM.

FIGS. 3 and 4 illustrate respective internal configurations for the column and dummy redundancy decision circuits 103 and 105. In FIGS. 3 and 4, a unit circuit section associated with a single redundant column is illustrated. Thus, these unit circuit sections are actually provided in the same number as that of the redundant columns. The column redundancy decision circuit 103 shown in FIG. 3 includes: a signal line 300 for the redundant column address pre-decoded signal SYP; and p- and n-channel transistors 301 and 302 for charging and discharging this signal line 300. The "first node" as defined in the appended claims is included in the signal line 300. The same number of exclusive-NOR gates 303 as the numbers of bits of the column address AY or the redundant column address RAY are provided. Each of these exclusive-NOR gates 303 compares an associated bit of the column address AY to that of the redundant column address RAY. The same number of n-channel transistors 304 (equivalent to the "transistors of the first group" as defined in the claims) are provided for the respective exclusive-NOR gates 303. Each of these n-channel transistors 304 operates responsive to the output of an associated one of the exclusive-NOR gates 303. These transistors 304 are connected in parallel to each other between the signal line 300 and ground (equivalent to the reference potential node as defined in the claims) to make up a wired OR circuit 305. An inverter 306 is further provided to invert the redundant column address pre-decoded signal SYP.

If the column redundancy decision circuit 103 shown in FIG. 3 has decided that every bit of the column address AY matches up to that of the redundant column address RAY, then the n-channel transistors 304 in the wired OR circuit 305 are all OFF. Once the column address AY has been determined, the redundancy clock signal RCLK (equivalent to the second timing signal as defined in the claims) falls to the L level to turn the p-channel transistor 301 ON. As a result, the signal line 300 starts to be charged and the redundant column address pre-decoded signal SYP rises to the H level. Thereafter, when the redundant clock signal RCLK rises to the H level, the n-channel transistor 302 turns ON. In this case, if the redundant column address RAY matches up to the column address AY, then the redundant column address pre-decoded signal SYP is kept high and the circuit 103 determines it's time to replace faulty components with redundant ones. Alternatively, if even a single bit of the redundant column address RAY is different from that of the column address AY, then the output of the associated exclusive-NOR gate 303 rises to the H level. Thus, the charge on the signal line 300 is drained through the associated n-channel transistor 304 and the n-channel transistor 302. As a result, the redundant column address pre-decoded signal SYP falls to the L level and therefore, redundant components associated with the redundant column address RAY will not be adopted for backup.

Like the column redundancy decision circuit 103, the dummy redundancy decision circuit 105 shown in FIG. 4 also includes: a signal line 400; and p- and n-channel transistors 401 and 402 for charging and discharging this signal line 400. The "second node" as defined in the appended claims is included in the signal line 400. The same number of n-channel transistors 403 (equivalent to the "transistors of the second group" as defined in the claims) as that of the n-channel transistors 304 of the wired OR circuit 305 in the column redundancy decision circuit 103 shown in FIG. 3 are provided. These n-channel transistors 304 and 403 are all of the same size. These transistors 403 are connected in parallel to each other between the signal line 400 and the ground to make up another wired OR circuit 404. An inverter 405 is further provided to invert the potential on the signal line 400 and thereby generate the end-of-redundancy-decision signal RED. In the wired OR circuit 404, a supply voltage Vdd is applied to the gate of a predetermined one of the n-channel transistors 403 and the gates of the other n-channel transistors 403 are grounded. Unlike the column redundancy decision circuit 103 shown in FIG. 3, the dummy redundancy decision circuit 105 shown in FIG. 4 is not provided with the exclusive-NOR gates 303.

Accordingly, in the dummy redundancy decision circuit 105 shown in FIG. 4 (which is equivalent to the signal generating means as defined in the appended claims), only one n-channel transistor 403, which receives the supply voltage Vdd at its gate, is always ON. Thus, no matter what column address AY is given, the dummy redundancy decision circuit 105 always finds the column address AY different from the redundant column address RAY. The reason that only one n-channel transistor 403 is always ON is as follows. In the column redundancy decision circuit 103 shown in FIG. 3, the charge on the signal line 300 for the redundant column address predecoded signal SYP is drained through the wired OR circuit 305. Thus, the smaller the number of non-matching bits, the later the point in time the redundant column address predecoded signal SYP settles at the H or L level. This point in time is delayed for the longest time if there is just one non-matching bit. Accordingly, the dummy redundancy decision circuit 105 defines the point in time the redundant column address pre-decoded signal SYP settles at the H or L level (i.e., the endpoint of the redundancy decision) as if just one bit was always non-matching. Whenever the dummy redundancy decision circuit 105 shown in FIG. 4 detects the endpoint of the redundancy decision, the output of the inverter 405, i.e., the end-of-redundancy-decision signal RED (i.e., the first timing signal), is always at the H level irrespective of the result of the address comparison by the decision circuit 103. That is to say, the dummy redundancy decision circuit 105 may also functions as the end-of-redundancy-decision signal output means as defined in the claims.

Referring back to FIG. 1, the control signal generator 106 (equivalent to the operation selecting means as defined in the claims) receives the end-of-redundancy-decision signal RED and the inverted redundant column address pre-decoded signal XSYP from the dummy and column redundancy decision circuits 105 and 103, respectively. If the signal XSYP is high when the signal RED rises to the H level (i.e., if a normal column should be selected), the generator 106 outputs an H-level normal column control signal NEN and an L-level redundant column control signal REN. The signal NEN is equivalent to the normal operation selecting signal as defined in the claims. On the other hand, if the signal XSYP is low at the endpoint of the redundancy decision (i.e., if a redundant column should be selected), the generator 106 outputs an H-level redundant column control signal REN and an L-level normal column control signal NEN. The signal REN is equivalent to the redundant operation selecting signal as defined in the claims.

Figure 5:
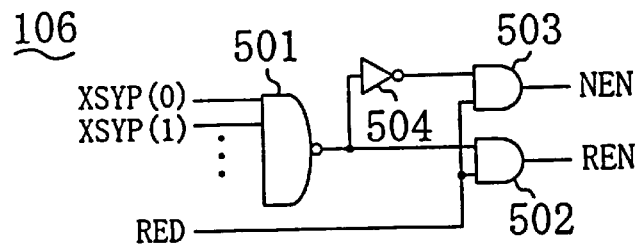
FIG. 5 is a circuit diagram illustrating a configuration for a control signal generator included in the DRAM.

FIG. 5 illustrates an internal configuration for the control signal generator 106. As shown in FIG. 5, an NAND gate 501 receives the same number of inverted redundant column address pre-decoded signals XSYP(0), XSYP(1), etc. (at the H-level when a normal column is selected) as that of redundant columns from the column redundancy decision circuit 103. A first AND gate 502 receives the end-of-redundancy-decision signal RED from the dummy redundancy decision circuit 105 and the output of the NAND gate 501, thereby generating the redundant column control signal REN. A second AND gate 503 receives the end-of-redundancy-decision signal RED from the dummy redundancy decision circuit 105 and a signal obtained by getting the output of the NAND gate 501 inverted by an inverter 504, thereby generating the normal column control signal NEN.

Thus, if at least one redundant column should be selected, the first AND gate 502 outputs the H-level redundant column control signal REN and the second AND gate 503 outputs the L-level normal column control signal NEN in the control signal generator 106 shown in FIG. 5. On the other hand, if a normal column should be selected, then the generator 106 outputs the L-level redundant column control signal REN and the H-level normal column control signal NEN.

Referring back to FIG. 1, the column decoder 102 receives not only the column address pre-decoded signal YP from the column pre-decoder 101, but also the normal column control signal NEN from the control signal generator 106. In synchronism with the leading edge of the normal column control signal NEN, the column decoder 102 outputs a normal column select signal Y. The redundant column decoder 104 receives not only the redundant column address pre-decoded signal SYP from the column redundancy decision circuit 103, but also the redundant column control signal REN from the control signal generator 106. In synchronism with the leading edge of the redundant column control signal REN, the redundant column decoder 104 outputs a redundant column select signal SY.

Figure 6:
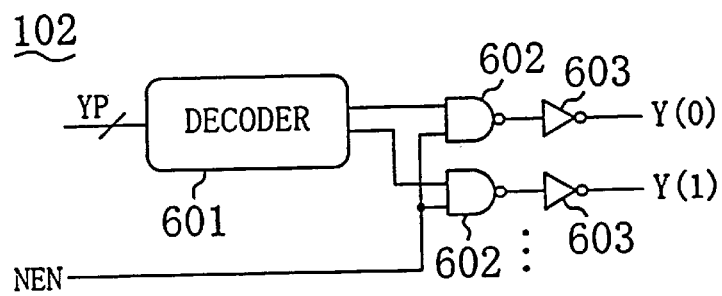
FIG. 6 is a circuit diagram illustrating a configuration for a column decoder included in the DRAM.

FIG. 6 illustrates an internal configuration for the column decoder 102. As shown in FIG. 6, a decoder 601 decodes the normal column address pre-decoded signal YP. The same number of NAND gates 602 as the number of bits of the given column address AY are provided. Each of these NAND gates 602 receives an associated bit of the output of the decoder 601 and the H-level normal column control signal NEN from the control signal generator 106. The same number of inverters 603 are provided for the respective NAND gates 602. Each of these inverters 603 inverts the output of the associated NAND gate 602, thereby outputting an associated bit Y(0), Y(1), etc. of the normal column select signal Y. Accordingly, the column decoder 102 shown in FIG. 6 does not generate the normal column select signal Y unless the decoder 102 receives the H-level normal column control signal NEN.

Figure 7:
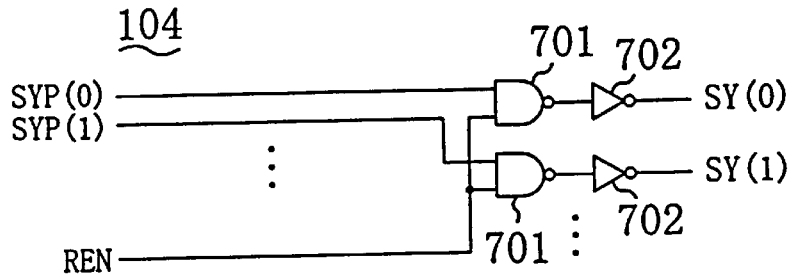
FIG. 7 is a circuit diagram illustrating a configuration for a redundant column decoder included in the DRAM.

FIG. 7 illustrates an internal configuration for the redundant column decoder 104. As shown in FIG. 7, the same number of NAND gates 701 as the number of redundant columns are provided. Each of these NAND gates 701 receives an associated redundant column address pre-decoded signal SYP(0), SYP(1), etc. (at the H level when a redundant column should be selected) from the column redundancy decision circuit 103 and the H-level redundant column control signal REN from the control signal generator 106. The same number of inverters 702 are provided for the respective NAND gates 701. Each of these inverters 702 inverts the output of the associated NAND gate 701. Accordingly, the redundant column decoder 104 does not generate the redundant column select signal SY unless the decoder 104 receives the H-level redundant column control signal REN.

In FIG. 1, the read amplifier controller 107 generates and outputs data line pre-charging and amplifying signals DLPRE and DLSEN responsive to the end-of-redundancy-decision signal RED supplied from the dummy redundancy decision circuit 105. The read amplifier controller 107 is equivalent to the signal producing means as defined in the appended claims.

Figure 2:
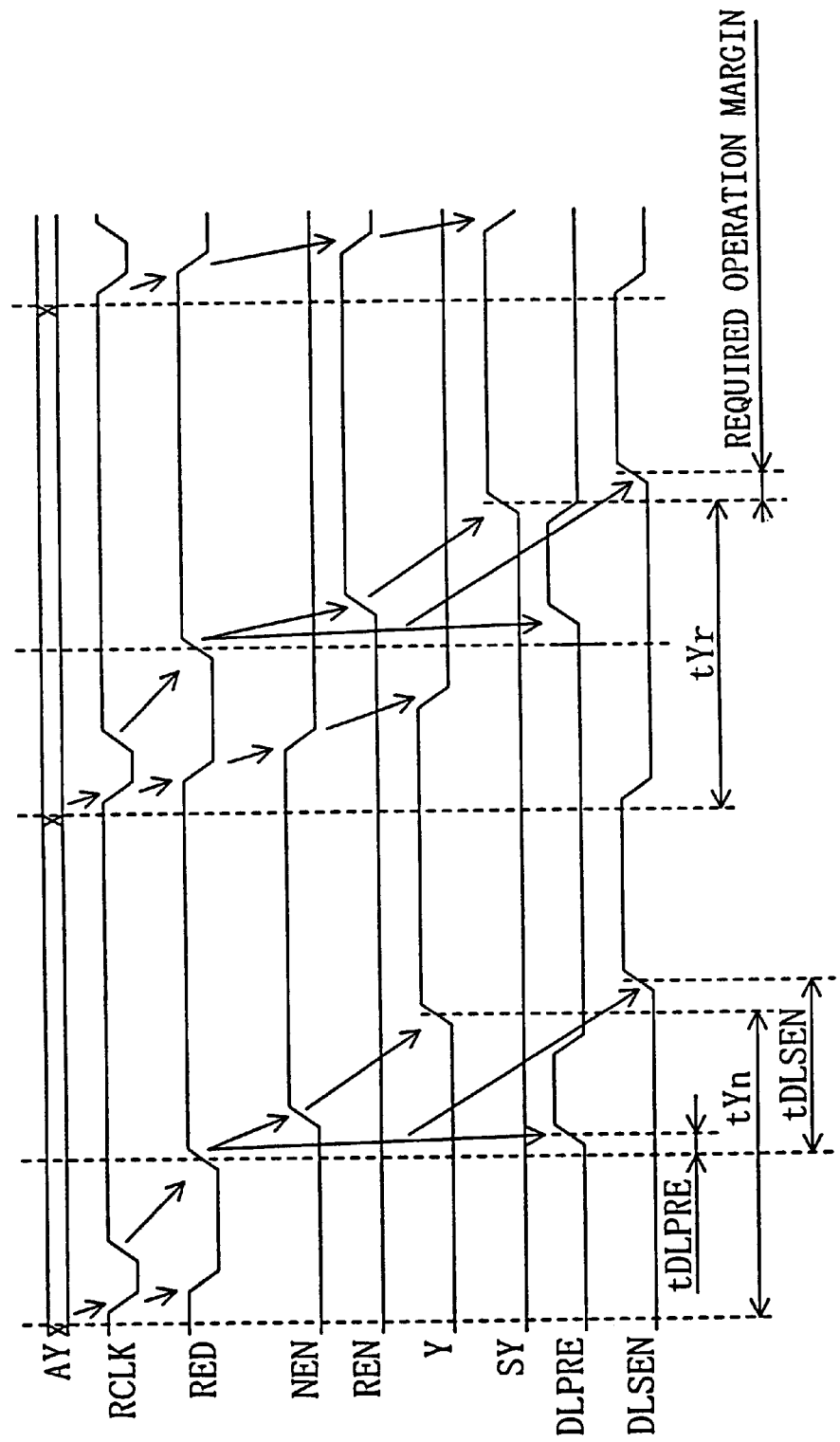
FIG. 2 is a timing diagram illustrating an operation timing relationship among the main circuit components used for selecting a column in the DRAM shown in FIG. 1.
Figure 8:
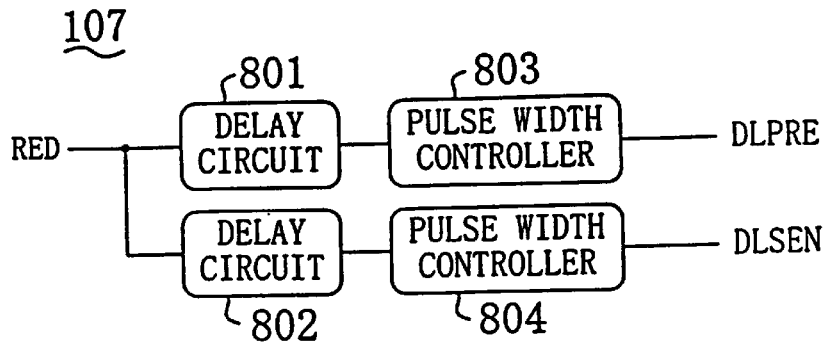
FIG. 8 is a circuit diagram illustrating a configuration for a read amplifier controller included in the DRAM.
Figure 9:
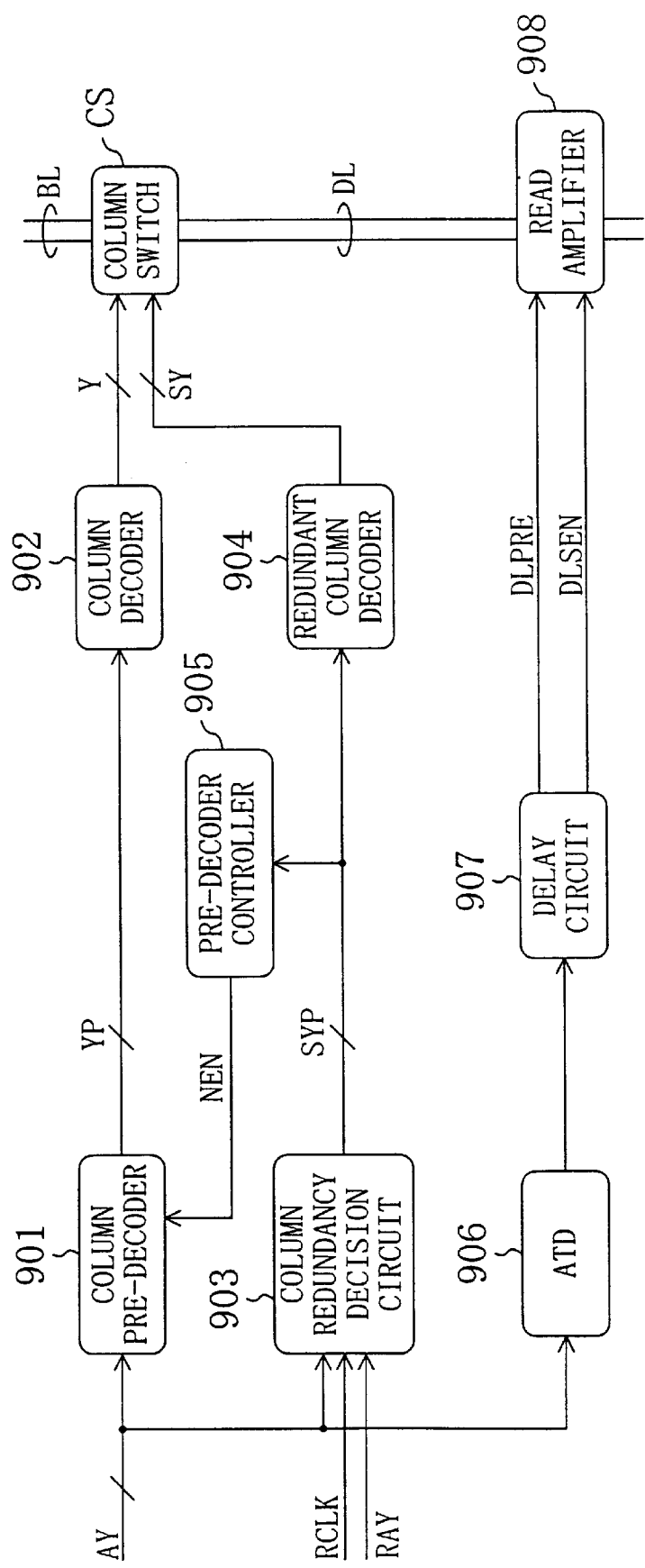
FIG. 9 is a block diagram illustrating main circuit components used for selecting a column in a conventional DRAM.

FIG. 8 illustrates an internal configuration for the read amplifier controller 107. As shown in FIG. 8, delay circuits 801 and 802 both receive the end-of-redundancy-decision signal RED from the dummy redundancy decision circuit 105 and delay this signal RED for respective amounts of time tDLPRE and tDLSEN as shown in FIG. 2. A pair of pulse width controllers 803 and 804 are provided for controlling the pulse widths of the respective outputs of the delay circuits 801 and 802, thereby outputting the data line pre-charging and amplifying signals DLPRE and DLSEN, respectively.

Thus, in the DRAM according to the present invention, the control signal generator 106 outputs the normal and redundant column control signals NEN and REN simultaneously. If a normal column should be selected, then the column decoder 102 outputs the normal column select signal Y in synchronism with the H-level normal column control signal NEN. On the other hand, if a redundant column should be selected, then the redundant column decoder 104 outputs the redundant column select signal SY in synchronism with the H-level redundant column control signal REN. Thus, the normal and redundant column select signals Y and SY are output at respective times tYn and tYr, which are both a predetermined time later than a point in time an associated column address AY was determined as shown in FIG. 2. That is to say, there is no phase difference between these signals Y and SY. Accordingly, the times the data line pre-charging and amplifying signals DLPRE and DLSEN are output may be defined with a reduced operation margin. As a result, the readout operation can be speeded up.

Figure 10:
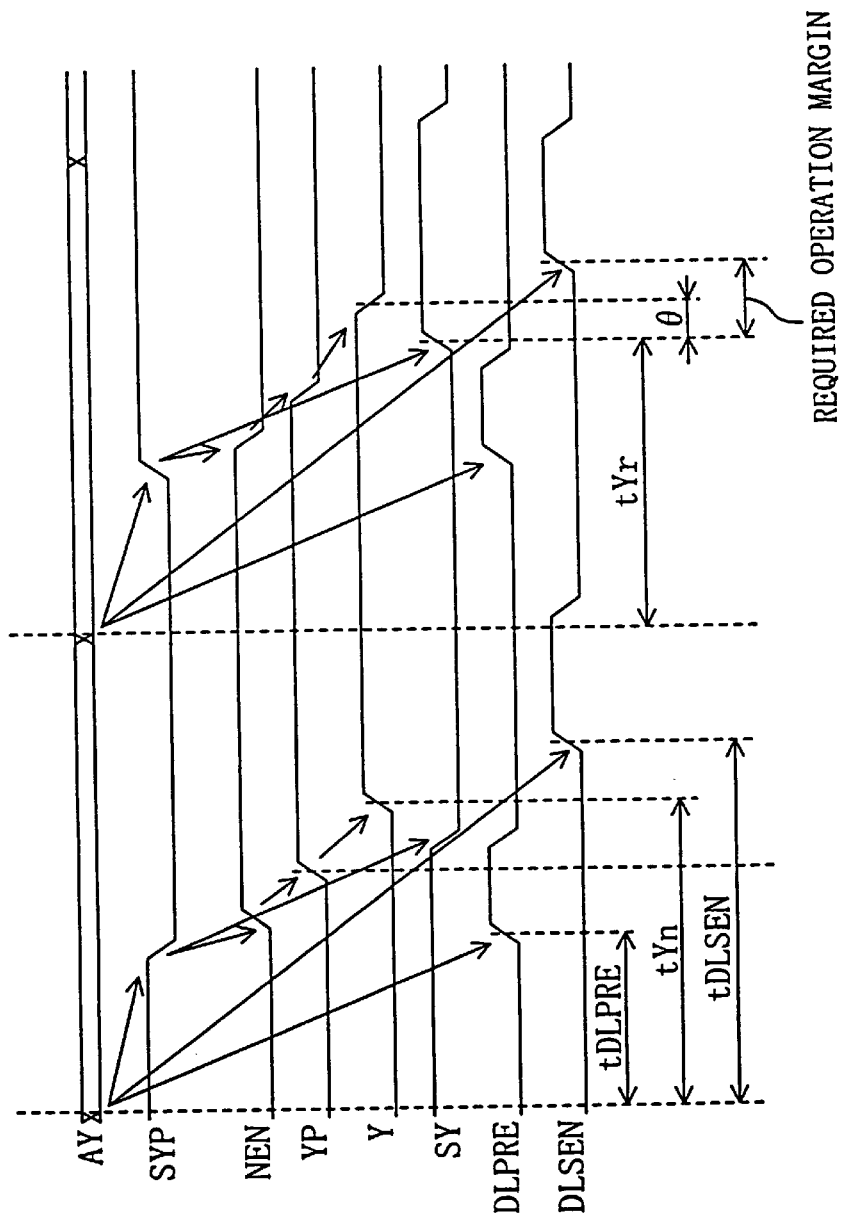
FIG. 10 is a timing diagram illustrating an operation timing relationship among the main circuit components used for selecting a column in the DRAM shown in FIG. 9.

In addition, the data line pre-charging and amplifying signals DLPRE and DLSEN, which are generated by the read amplifier controller 107, have their pulse widths controlled to be delayed from the end-of-redundancy-decision signal RED for respective amounts of time tDLPRE and tDLSEN as shown in FIG. 2. These delay times tDLPRE and tDLSEN shown in FIG. 2 are much shorter than the counterparts shown in FIG. 10, which are also defined with reference to a point in time an associated column address AX is determined. Accordingly, there will be a smaller variation in the delays caused by the pair of delay circuits 801 and 802 in the read amplifier controller 107. That is to say, the timing relationship between the data line pre-charging and amplifying signals DLPRE and DLSEN can be precisely controlled and the operation margin can be drastically cut down. As a result, data can be read out far faster.

It should be noted that the present invention is in no way limited to the foregoing specific embodiment. For example, in the foregoing embodiment, the control signal generator 106 operates responsive to the end-of-redundancy-decision signal RED. Alternatively, a signal obtained by delaying the signal RED for a predetermined amount of time or a separately generated signal may also be used. Also, in the foregoing embodiment, the present invention is applied to column selection control in a DRAM. As an alternative, the present invention is applicable to column selection control in an SDRAM or SRAM.

As is apparent from the foregoing description, the semiconductor storage device according to the present invention outputs the normal and redundant column select signals at respective times later than a reference time by an interval of the same length to select normal and redundant columns, respectively. That is to say, the phase difference between these signals can be eliminated. Accordingly, the interval between the end of data line pre-charging and the start of data line potential amplification can be shortened, thus contributing to speeding up the readout operation.

In particular, the semiconductor storage device according to the present invention can drastically cut down a delay time, which is supposed to be caused by a delay device in generating the data line pre-charging and amplifying signals. Thus, not only a variation in delay time, but also a required timing margin between the end of data line pre-charging and the start of data line potential amplification can be minimized. As a result, data can be read out much faster.

What is claimed is:

1. A semiconductor storage device comprising:
   a normal column select circuit for outputting a normal column select signal in response to a normal column control signal;
   a redundant column select circuit for outputting a redundant column select signal in response to a redundant column control signal;
   a column switch for coupling a bit line to a data line in response to the normal column select signal or the redundant column select signal;
   redundancy decision means for generating a decision signal indicative of whether or not an input column address corresponds to a redundant column address, the redundancy decision means being activated in response to a first timing signal;
   signal generating means for generating a second timing signal in response to the first timing signal; and
   operation selecting means for receiving the decision signal and for selectively activating the normal column control signal or the redundant column control signal in response to the second timing signal.

2. The device of claim 1, wherein
   the redundancy decision means includes:
   an address comparing circuit comprising a first group of transistors connected in parallel between a first node and a second node, the address comparing circuit being adapted such that at least one of the first group of transistors is placed in a conductive state when the input column address does not correspond to the redundant column address, and that none of the first group of transistors is placed in a conductive state when the input column address corresponds to the redundant column address; and
   a first switch means interposed between the second node and a reference potential node, the first switch means being activated in response to the first timing signal,
   the signal generating means includes:
   a second group of transistors connected in parallel between a third node and a fourth node, at least one of the second group of transistors being always in a conductive state irrespective of the input column address; and
   a second switch means interposed between the fourth node and the reference potential node, the second switch means being activated in response to the first timing signal,
   the redundancy decision means generates the decision signal based on a potential at the first node, and
   the signal generating means generates the second timing signal based on a potential at the third node.

3. The device of claim 2, wherein the number of the transistors in the second group is equal to the number of the transistors in the first group.

4. The device of claim 2, wherein
   the redundancy decision means is adapted such that the first node is pre-charged when the first timing signal is not active, and
   the signal generating means is adapted such that the third node is pre-charged when the first timing signal is not active.

5. The device of claim 1, further comprising a read amplifier controller responsive to the second timing signal to generate data line pre-charging and amplifying signals for controlling operations of a read amplifier coupled to the data line.

* * * * *

UNITED STATES PATENT AND TRADEMARK OFFICE
CERTIFICATE OF CORRECTION

PATENT NO.    : 6,219,285 B1
DATED         : April 17, 2001
INVENTOR(S)   : Yasuo Murakuki et al.

It is certified that error appears in the above-identified patent and that said Letters Patent is hereby corrected as shown below:

<u>Title page,</u>
Assignee's name appears incorrectly as "Mitsushita Electric Industrial Co., Ltd."
The correct spelling of the Assignee is -- Matsushita Electric Industrial Co., Ltd. --
"Mitsushita" should be -- Matsushita --

Signed and Sealed this

Twenty-first Day of May, 2002

Attest:

*Attesting Officer*

JAMES E. ROGAN
*Director of the United States Patent and Trademark Office*